(12) United States Patent
Bornschein et al.

(10) Patent No.: US 8,134,790 B2
(45) Date of Patent: Mar. 13, 2012

(54) OPTICAL MOUNTING AND OPTICAL COMPONENT COMPRISING SAID TYPE OF OPTICAL MOUNTING

(75) Inventors: Marco Bornschein, Jena (DE); Thomas Schletterer, Stadtroda (DE)

(73) Assignee: Jenoptik Optical Systems GmbH, Jena (DE)

( * ) Notice: Subject to any disclaimer, the term of this patent is extended or adjusted under 35 U.S.C. 154(b) by 83 days.

(21) Appl. No.: 12/532,016

(22) PCT Filed: Mar. 19, 2008

(86) PCT No.: PCT/DE2008/000488
§ 371 (c)(1),
(2), (4) Date: Dec. 4, 2009

(87) PCT Pub. No.: WO2008/113341
PCT Pub. Date: Sep. 25, 2008

(65) Prior Publication Data
US 2010/0073786 A1    Mar. 25, 2010

(30) Foreign Application Priority Data
Mar. 20, 2007   (DE) .......................... 10 2007 014 155

(51) Int. Cl.
*G02B 7/02* (2006.01)
(52) U.S. Cl. .................... 359/824; 359/822; 359/819

(58) Field of Classification Search .......... 359/694–704, 359/811–824
See application file for complete search history.

(56) References Cited

U.S. PATENT DOCUMENTS

| | | | |
|---|---|---|---|
| 6,175,451 B1 * | 1/2001 | Iriyama et al. | 359/627 |
| 6,259,571 B1 * | 7/2001 | Holderer et al. | 359/819 |
| 7,342,732 B2 * | 3/2008 | Dang et al. | 359/819 |
| 7,612,956 B2 * | 11/2009 | Blanding et al. | 359/823 |
| 7,903,353 B2 * | 3/2011 | Reichmann et al. | 359/813 |
| 7,916,408 B2 * | 3/2011 | Blanding et al. | 359/813 |
| 2004/0189969 A1 | 9/2004 | Mizuno | 355/671 |

FOREIGN PATENT DOCUMENTS

| | | |
|---|---|---|
| DE | 100 43 344 C2 | 12/2001 |
| DE | 102 09 661 A1 | 9/2003 |
| EP | 1 014 139 A2 | 6/2000 |
| EP | 1 677 133 A1 | 7/2006 |
| JP | 2006-039319 | 2/2006 |
| WO | WO 2006/119970 A2 | 11/2006 |

* cited by examiner

*Primary Examiner* — Mohammed Hasan
(74) *Attorney, Agent, or Firm* — Duane Morris LLP

(57) ABSTRACT

The invention relates to an optical mounting comprising a stationary outer mounting and an inner mounting part embodied to receive an optical element. The aim of the invention is to enlarge the adjustment path in the direction of the optical axis of the optical element that is to be mounted, and as a result, obtaining high stability and rigidity that is perpendicular to the optical axis. Also, the invention aims at keeping the space requirements and the manufacturing and mounting costs as low as possible.

6 Claims, 3 Drawing Sheets

OPTICAL MOUNTING AND OPTICAL COMPONENT COMPRISING SAID TYPE OF OPTICAL MOUNTING

RELATED APPLICATIONS

The present application is a U.S. National Stage application of International PCT Application No. PCT/DE2008/000488 filed on Mar. 19, 2008, which claims benefit of German Application No. DE 10 2007 014 155.8 filed on Mar. 20, 2007, the contents of each are incorporated by reference in their entirety.

FIELD OF THE INVENTION

The present invention relates to an optical mount with a stationary outer mount and an inner mount piece for receiving an optical element. The optical mount is especially suitable for use with projection lenses that are exposed to high heat, during operation.

BACKGROUND OF THE INVENTION

In addition to the requirement that the optical elements be mounted at low tension, mounts for high-performance lenses also require an adjusting mechanism by means of which the mounted optical element can be moved in an axial and a radial direction. When operating such a high-performance lens, it is especially necessary to be able to adjust the mounted optical element within a wide range of axial directions since such an adjustment allows focal tracking, which is necessary because of the high thermal load, as well as a correction of other image aberrations, e.g., astigmatism and curvature of field.

Prior Art

DE 100 43 344 C2 solves the problem of a low-tension mounting system with an elastic lens holder with radially elastic segments, the free ends of which engage under pretension in an annular groove along the peripheral surface of a lens, as a result of which the lens can be mounted at low tension, directly and without having additional means disposed on its peripheral surface.

In an assembly comprising an optical element and a mount according to DE 199 04 152 A1, only a relatively short adjustment path in the direction of the optical axis is achieved since the optical element is directly or indirectly connected to the mount by means of a membrane-like jointing element. Another disadvantage is that the membrane-like jointing element engages directly in the optical element.

In DE 102 09 661 A1, an inner and an outer mount are connected to each other by means of elastically deformable strips, with each strip being connected to the inner mount and the outer mount via a fastening section. The fastening sections are connected to each other by means of a curved section and free bearing parts in between.

The disadvantage is the tolerance sensitivity of the rolling strip, the design of which is complicated and the manufacturing and assembly of which are technically difficult to manage. The mount comprises a plurality of components and requires considerable space for installation along the optical axis.

EP 1 014 139 A2, EP 1 677 133 A1 and U.S. Pat. No. 6,259,571 B1 disclose optical mounts, each having an outer mount and an inner mount which can be adjusted relative to the outer mount. In EP 1 014 139 A2, actuators (8a, 8b, 9a, 9b) generate compressive and tensile forces which targetedly deform an inner ring via a radial force/displacement transmission. The targeted deformation of the optical elements seeks to influence certain image aberrations. To be able to targetedly deform the optical element, at least 4 connecting points between the outer ring and the inner ring are required, which connecting points are formed by levers. The disadvantage of this solution, however, is that it abandoned the isostatic characteristics that have a negative effect on the stress behavior [sic].

EP 1 677 133 A1 discloses a holding device for micro-optical components which comprises a multi-curved holder connected to an inner part for receiving the micro-optical component. The multi-curved holder of this embodiment, however, is not a closed outer ring, but has three gaps, which means that there is no closed—and therefore rigid—outer and inner ring to ensure accurate movement in defined degrees of freedom without deformation of the optical element. Furthermore, in the direction of the optical axis, the configuration described in the document cited is designed to be rigid with respect to the directions at right angles to the optical axis.

In U.S. Pat. No. 6,259,571 B1, a stationary outer ring and an adjustable inner ring with an optical element is disclosed. The configuration uses a tipping lever (5) which serves primarily to increase the sensitivity and to reverse the direction. However, the adjustment path that is possible with this configuration is comparatively short (lever rule).

In addition, WO 2006119970 A2 discloses a solution which allows an optical element 1 to be adjusted in a plurality of degrees of freedom. To this end, this embodiment provides for a targetedly deformable intermediate ring to be disposed between the stationary outer ring and the adjustable inner ring. The deformations of the intermediate ring are picked up by the inner ring and manifest themselves on the inner ring in the form of translatory movements that are possible in 5 degrees of freedom. The translatory movements are effectuated via the deformations of the intermediate ring, i.e., involved as a force actuator, which in turn can lead to undesirable stresses.

Objects of the Invention

The problem to be solved by the present invention is to lengthen the adjustment path along the optical axis of the optical element to be mounted and thus to obtain high stability and rigidity in a direction perpendicular to the optical axis, while avoiding the disadvantages of the prior art to the greatest extent possible. In addition, the space required for installation and the manufacturing and assembly costs should be kept as low as possible.

According to the present invention, this problem is solved with an optical mount of the type described earlier in that the inner mount piece is enclosed by elastic annular disks that are disposed coaxially with respect to one another in one plane, which annular disks are connected to one another, to the inner mount piece, and to the outer component by means of bending beams. According to the present invention, this generates a rigid body motion of the inner mount piece in the direction of the optical axis.

When the bending beams are arranged so as to be staggered relative to one another by 120° so that a connection is made only at three points, deformations that act upon the outer mount, e.g., as a result of the assembly procedure, are attenuated considerably before they are able to reach the optical element. Thus, a transmission is largely ruled out.

In order to keep the actuator forces to a minimum, the bending beams 6 are designed to have little rigidity in the direction of the optical axis. In all other directions, particularly at right angles to the optical axis, they should be as rigid as possible so as to counteract a decentration of the optical element 2 during adjustment.

SUMMARY OF THE INVENTION

According to the present invention, the bending beams are connected to the outer ring (outer mount) and the inner ring (inner mount piece) at only three points, thereby ensuring that deformations are kept at the greatest distance from the optical element.

The solution to the problem is characterized by closed and thus rigid outer and inner rings, which rings are connected to one another by means of bending beams. It is only because of this particular characteristic, i.e., that the outer and the inner rings are rigid and that the intended degrees of freedom are generated exclusively by the bending beams, that a unique and non-forced rigid body motion is possible.

Thus, the connection between the inner mount piece and the outer mount is implemented by way of a nested spring system which, because of the large spring deflections, ensures long adjustment paths along the optical axis of the optical element to be mounted, while ensuring high rigidity in a direction perpendicular to the optical axis. In contrast to the prior art, the translatory movements are generated directly by the actuators, without additional force transmission.

It is especially useful when the outer mount, the inner mount piece and the elastic annular disks are formed integrally in one piece. Thus, the adjustment mechanism is composed of elastic annular disks which, without reversal of direction, serve to generate the longest possible adjustment path. To this end, a plurality of annular disks can be nested one inside the other. Because of the technically simple production of the symmetrical structure in a single piece, it is possible to avoid risk-prone mechanical connections such as screw connections or other additional connecting elements, as well as the use of different materials, which ensures high long-term stability. Consequently, the outer mount and the inner mount piece have no clearance. The optical mount requires little space for installation.

Another subject matter of the present invention relates to an optical assembly in which the optical mount with the mounted optical element is fitted into a tubular carrier having actuating means that are disposed outside the effective range of the optical element and which act on the inner mount piece. In addition, measuring elements are attached to the tubular carrier for measuring the adjustment path in the direction of the optical axis of the optical element.

The actuating means are preferably motors that are staggered relative to each other by 120° and that act via spindles on the inner mount piece. As a result, it is, specifically, also possible to tilt the inner mount piece, and thus the optical element, relative to the outer mount in order to minimize image aberrations.

In another embodiment of the present invention, the actuating means provided can be piezo elements that act via levers on the inner mount piece.

DESCRIPTION OF THE DRAWINGS

The invention will be described in greater detail below, using a schematic drawing for illustration. As can be seen.

DESCRIPTION OF THE EMBODIMENTS

Figure 1:
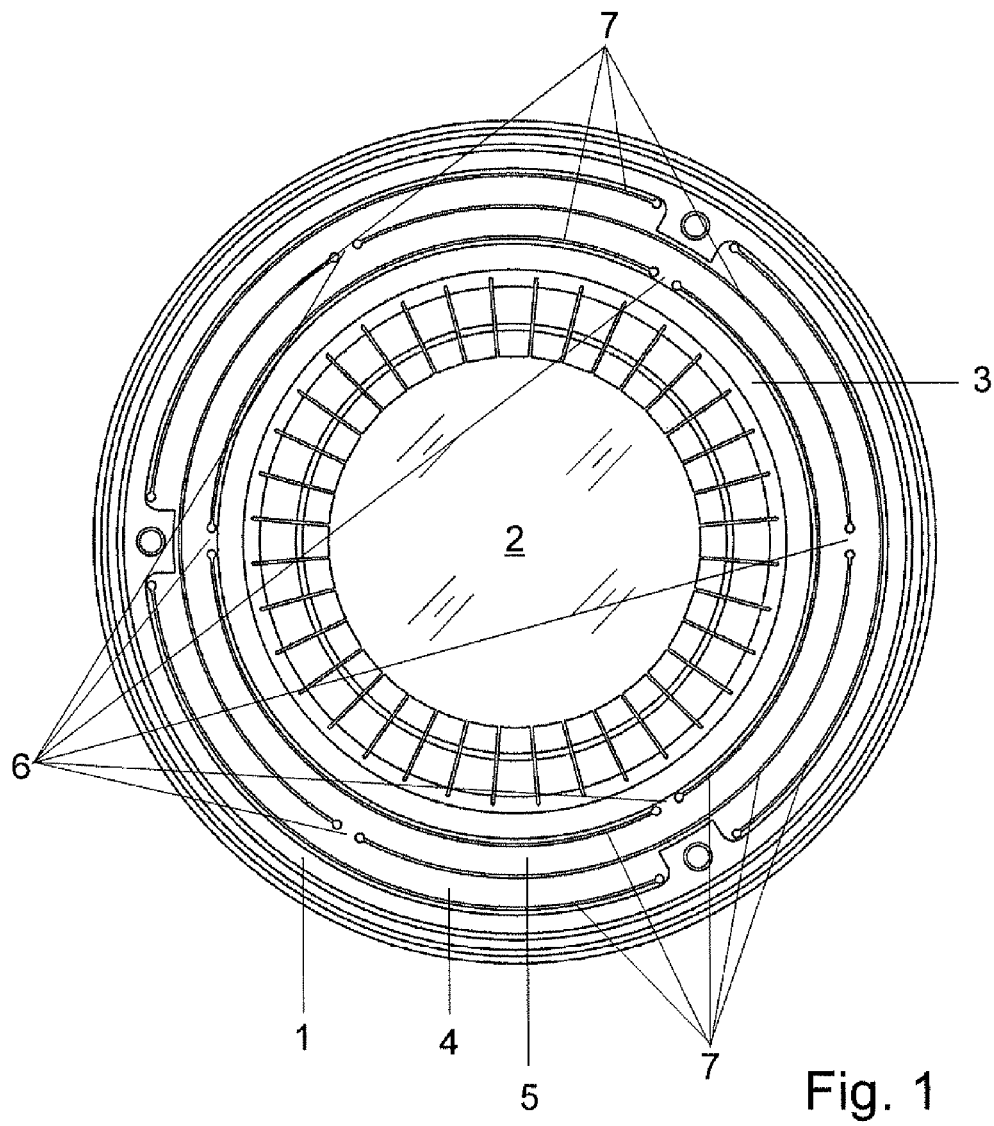
FIG. 1 shows a top view of an optical mount according to the present invention.
Figure 2:
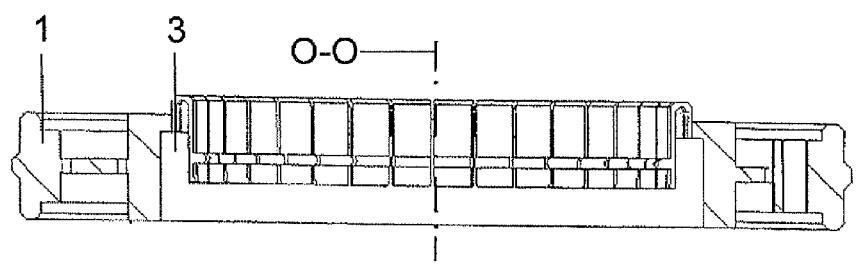
FIG. 2 shows a section through the optical mount.
Figure 3:
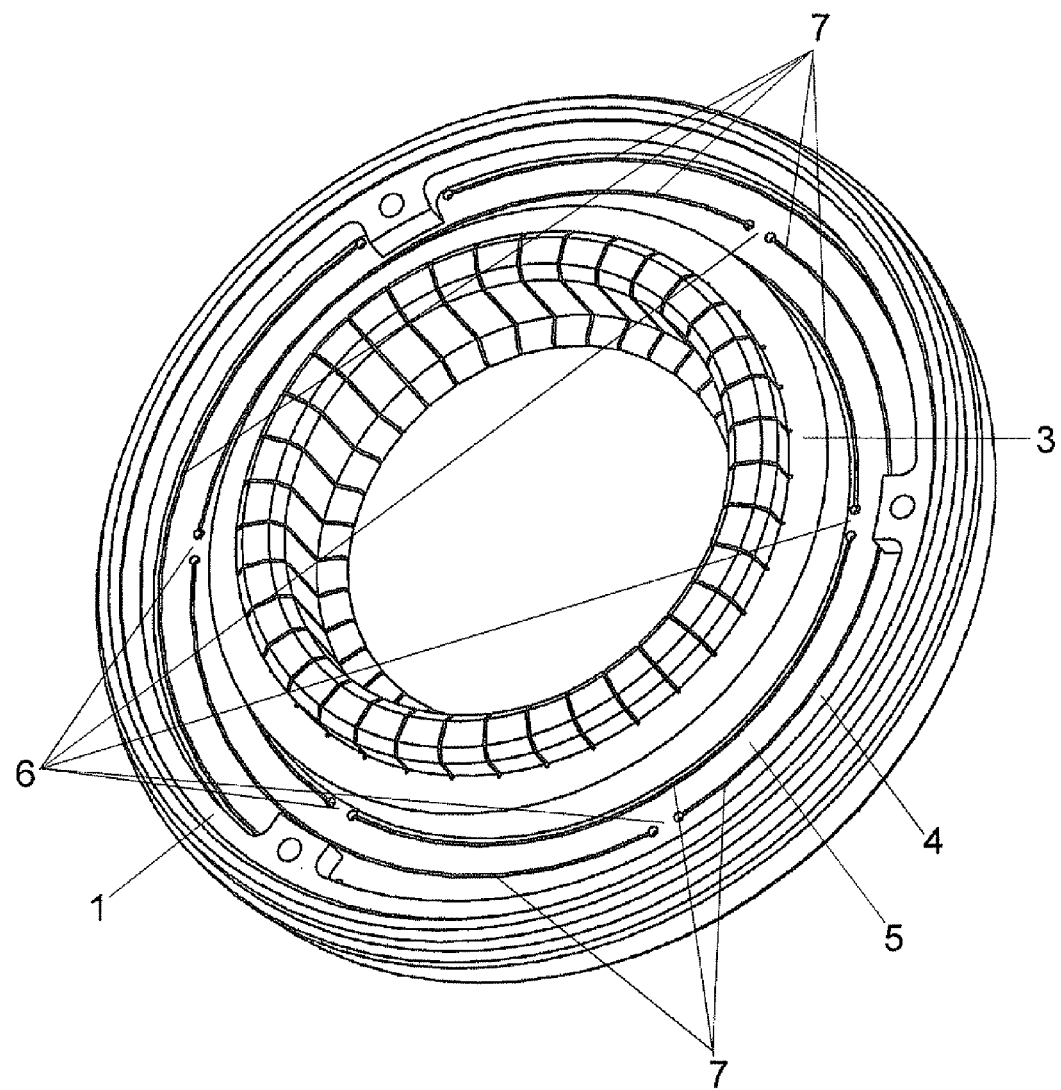
FIG. 3 shows a perspective view of the optical mount.

The optical mount shown in FIGS. 1 to 3 comprises a stationary outer mount 1 and an inner mount piece 3 which can be adjusted relative to the outer mount in the direction of the optical axis O-O of an optical element 2 that is to be mounted. The inner mount piece 3 can be adjusted by means of a leaf-type spring system of elastic annular disks 4,5 which are disposed coaxially with respect to one another in one plane and which are connected to one another, to the inner mount piece 3, and to the outer mount 1 by means of bending beams 6 that are staggered relative to one another by 120°. The elastic annular disks 4,5 form series-connected leaf springs that, except for the bending beams 6, are separated from one another by eroded slits 7, which makes it possible to obtain a long adjustment path in the direction of the optical axis O-O.

The inner mount piece 3 for holding the optical element is designed as described in DE 100 43 344 C2, the disclosure of which is hereby included by reference.

Figure 4:
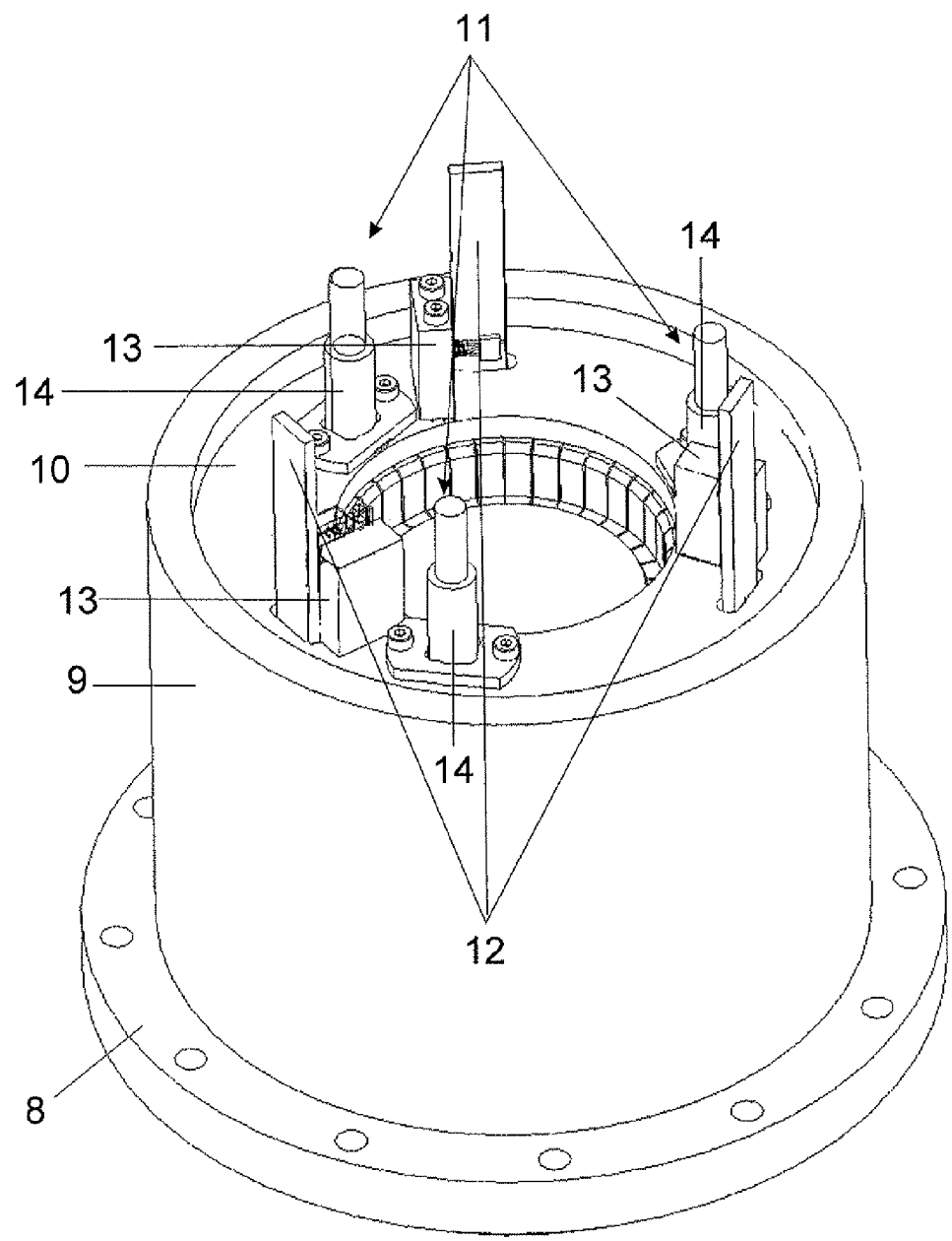
FIG. 4 shows an optical assembly that comprises an optical mount as seen in FIGS. 1 to 3.

The optical mount according to FIGS. 1 to 3 is suitable for use in an optical assembly, such as is shown, e.g., in FIG. 4. The optical assembly is composed of a tubular carrier 9 that has a supporting flange 8 and that is designed, e.g., as the lens tube, and into which the optical mount and a circular carrier plate 10 are inserted, which carrier plate leaves exposed the effective range of the optical element 2, in particular an optical lens, that is mounted in the optical mount.

The circular carrier plate 10 serves to hold the actuating means 11 that act on the inner mount piece 3 so as to enable compensation for the thermally induced focus changes by adjusting the inner mount piece 3 in the direction of the optical axis OO of the mounted optical element 2. By means of measuring elements which are also attached to the circular carrier plate 10 and which consist of rulers 12 as dimensional standards and encoders 13, it is possible to determine the adjustment path. Not shown is a focus sensor that is used to determine a change in the focal plane or an automatic control system that is connected to the focus sensor and that determines the required focus tracking by adjusting the inner mount piece 3 via the actuating means 11.

In the embodiment according to FIG. 4, actuating motors 14, which are disposed inside the tubular carrier 9 so as to be staggered relative to one another by 120°, are attached as actuating means 11 on the circular carrier plate 10, which actuating motors act via spindles (not shown) through the carrier plate 10 on the inner mount piece 3.

As an alternative, it is also possible to use piezo actuators, which can exert pressure on the inner mount piece 3 via suitable levers.

What is claimed is:

1. An optical mount comprising a stationary outer mount and an inner mount piece that is adjustable relative to the outer mount and that serves to receive an optical element, wherein said inner mount piece is enclosed by elastic annular disks, which are disposed coaxially with respect to one another in one plane, and which are connected to one another, to the inner mount piece and to the outer mount via bending beams in such a manner that a rigid body motion of the inner mount piece is generated in the direction of the optical axis, and wherein the bending beams are connected to the outer mount and to the inner mount piece at three points, the bending beams are disposed so as to be staggered relative to one another by 120°, and the bending beams are designed in such a manner that their rigidity in the direction of the optical axis is relatively low and their rigidity in all other directions is relatively high.

2. The optical mount as in claim 1, wherein the outer mount, the inner mount piece and the elastic annular disks are integrally formed in one piece.

3. The optical mount as in claim 1, wherein the elastic annular disks are nested one inside the other.

4. An optical assembly comprising an optical element in an optical mount according to claim 1, wherein the bending beams are connected to the outer mount and to the inner mount piece at three points, the bending beams are disposed so as to be staggered relative to one another by 120°, and the bending beams are designed in such a manner that their rigidity in the direction of the optical axis is relatively low and their rigidity in all other directions is relatively high; and wherein the optical mount with the mounted optical element is fitted into a tubular carrier having actuating means disposed outside the effective range of the optical element, which actuating means act on the inner mount piece and in that measuring elements for measuring the adjustment path in the direction of the optical axis of the optical element are attached to the tubular carrier.

5. The optical assembly as in claim 4, wherein the actuating means used are actuating motors, which are disposed so as to be staggered relative to one another by 120° and which act on the inner mount piece via spindles.

6. The optical assembly as in claim 4, wherein the actuating means used are piezo elements which act on the inner mount piece via levers.

* * * * *